(12) United States Patent
Adeeb et al.

(10) Patent No.: US 10,037,259 B2
(45) Date of Patent: Jul. 31, 2018

(54) ADAPTIVE DEBUG TRACING FOR MICROPROCESSORS

(71) Applicant: International Business Machines Corporation, Armonk, NY (US)

(72) Inventors: Khandker N. Adeeb, Austin, TX (US); Steven J. Battle, Austin, TX (US); Brandon R. Goddard, Friendswood, TX (US); Dung Q. Nguyen, Austin, TX (US); Tu-An T. Nguyen, Austin, TX (US); Nicholas R. Orzol, Austin, TX (US); Brian D. Victor, Austin, TX (US); Brendan M. Wong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 178 days.

(21) Appl. No.: 15/138,593

(22) Filed: Apr. 26, 2016

(65) Prior Publication Data
US 2017/0308454 A1   Oct. 26, 2017

(51) Int. Cl.
| G06F 11/00 | (2006.01) |
| G06F 11/34 | (2006.01) |
| G06F 11/30 | (2006.01) |
| G01R 31/317 | (2006.01) |

(52) U.S. Cl.
CPC .... *G06F 11/3495* (2013.01); *G01R 31/31705* (2013.01); *G06F 11/3024* (2013.01)

(58) Field of Classification Search
CPC ............ G06F 11/3466; G06F 11/3495; G01R 31/31705
See application file for complete search history.

(56) References Cited

U.S. PATENT DOCUMENTS

| 5,996,092 | A | 11/1999 | Augsburg et al. |
| 6,142,683 | A | 11/2000 | Madduri |
| 6,397,382 | B1 | 5/2002 | Dawson |
| 6,791,352 | B2* | 9/2004 | Verdoorn ............ G01R 31/317 326/16 |
| 6,802,031 | B2* | 10/2004 | Floyd .................... G06F 11/348 714/29 |
| 7,152,186 | B2 | 12/2006 | Airaud et al. |
| 7,332,929 | B1 | 2/2008 | Normoyle et al. |
| 7,627,784 | B1 | 12/2009 | Allen et al. |
| 9,037,911 | B2* | 5/2015 | Rentschler .............. G06F 11/22 714/34 |
| 9,170,901 | B2* | 10/2015 | Bailey ................ G01R 31/3177 |
| 9,442,815 | B2* | 9/2016 | Nixon ..................... G06F 11/27 |

(Continued)

OTHER PUBLICATIONS

Liu, Xiao et al., On Multiplexed Signal Tracing for Post-Silicon Validation, 2013, IEEE, pp. 748-759 (Year: 2013).*

(Continued)

*Primary Examiner* — Marc Duncan
(74) *Attorney, Agent, or Firm* — Patterson + Sheridan, LLP

(57) ABSTRACT

Systems, methods, and apparatuses to perform an operation comprising receiving an indication of a first error in a processor, identifying a first control signal, of a plurality of control signals in a debug bus, associated with the error, wherein each of the plurality of control signals are coupled to one of a plurality of input ports of a multiplexer, and changing a configuration state of the multiplexer to output the first control signal to a trace array.

20 Claims, 4 Drawing Sheets

(56) References Cited

U.S. PATENT DOCUMENTS

| | | | |
|---|---|---|---|
| 9,547,040 B2* | 1/2017 | Larzul | G01R 31/31703 |
| 2011/0047427 A1* | 2/2011 | Bailey | G01R 31/3177 |
| | | | 714/732 |
| 2014/0053036 A1* | 2/2014 | Nixon | G01R 31/31705 |
| | | | 714/734 |
| 2014/0095941 A1* | 4/2014 | Carlough | G06F 11/34 |
| | | | 714/45 |

OTHER PUBLICATIONS

Zhu, Charlie Shucheng and Sharad Malik, Optimizing Dynamic Trace signal Selection Using Machine Learning and Linear Programming, 2015, EDAA, pp. 1289-1292 (Year: 2015).*

Basu, Kanad et al., Dynamic Selection of Trace Signals for Post-Silicon Debug, 2013, IEEE, pp. 62-66 (Year: 2013).*

Liu et al., "On Signal Tracing in Post-Silicon Validation", Asian Test Symposium, 2008, ATS'08, 17th IEEE, 2008, 6 pages.

Abramovici, et al., "A Reconfigurable Design-for-Debug Infrastructure for SoCs", Proceedings of the 43rd annual Design Automation Conference, Jul. 24-28, 2006, ACM, 2006, 6 pages.

Tang et al., "In-band Cross-Trigger Event Transmission for Transaction-Based Debug", Proceedings of the conference on Design, Automation and Test in Europe, ACM, 2008, 6 pages.

Jiang et al., "Enhancing Reliability and Flexibility of a System-On-Chip Using Reconfigurable Logic", Circuits and Systems, 2005, 48th Midwest Symposium, IEEE, 2005, 4 pages.

* cited by examiner

ADAPTIVE DEBUG TRACING FOR MICROPROCESSORS

BACKGROUND

The present invention relates to computer microprocessors, and more specifically, to adaptive debug tracing for computer microprocessors.

In computer microprocessors, signals that show the state of the machine are gathered into debug busses and are written cycle by cycle into outwardly visible memory structures, called trace arrays, to offer some visibility into the internal workings of microprocessors during debug stages on a fabricated microprocessor However, due to physical constraints, all of the signals necessary to understand the full state of the machine cannot be included on the debug bus. Therefore a selection method is necessary to choose a small group of signals that represent various sections of the microprocessor.

Current selection techniques allow only one set of signals per debug bus to be sent to the trace arrays during operation. These sets of signals may or may not be relevant to the problem at hand. The signals are generally chosen through predetermined selects that are scanned in during startup. The saved cycles of that signal group's behavior are visible in the trace array upon a failure.

Since the selected signals are static, these signals can only be changed by restarting the processor and scanning in new select signals. When an error is detected, the trace array will freeze this data, and preserve the states of the processor prior to the error condition. However, since the debug bus is set statically at the time the processor is powered on, the signal group selected at startup, and captured at the time of error, may not be necessarily relevant to the issue that the processor is experiencing.

Conventionally, the lab debugging process involves iterative guesswork, restarting the machine, and scanning in a new set of multiplexer (mux) selects based on the behavior exhibited by the currently selected signal group repeatedly until the faulty behavior is exposed.

This entire process involves a lot of time spent looking for relevant data and may take even longer, because debug busses are used to debug fails that are not cycle reproducible. However, there is only a limited time to debug, because once a fail is found, the manufacturing pipeline halts and productivity is lost.

SUMMARY

In one embodiment, a method comprises receiving an indication of a first error in a processor, identifying a first control signal, of a plurality of control signals in a debug bus, associated with the error, wherein each of the plurality of control signals are coupled to one of a plurality of input ports of a multiplexer, and changing a configuration state of the multiplexer to output the first control signal to a trace array.

In another embodiment, a processor comprises a debug bus, a multiplexer, and logic configured to perform an operation comprising receiving an indication of a first error in a processor, identifying a first control signal, of a plurality of control signals in a debug bus, associated with the error, wherein each of the plurality of control signals are coupled to one of a plurality of input ports of a multiplexer, and changing a configuration state of the multiplexer to output the first control signal to a trace array.

In still another embodiment, a system comprises a processor configured to perform an operation comprising receiving an indication of a first error in a processor, identifying a first control signal, of a plurality of control signals in a debug bus, associated with the error, wherein each of the plurality of control signals are coupled to one of a plurality of input ports of a multiplexer, and changing a configuration state of the multiplexer to output the first control signal to a trace array.

DETAILED DESCRIPTION

Embodiments disclosed herein dynamically change the selects for debug signal groups in a debug bus based on predetermined error triggers. The predetermined error triggers may be combinations of debug bus events and control signals from control logic of the processor. When a potential error is identified, embodiments disclosed herein may dynamically modify a multiplexer (or mux) to output the debug signal group associated with the potential error. For example, predictive logic may be used in work around triggers that are used to anticipate and work around known errors in a processor. If the work around logic is invoked, embodiments disclosed herein may modify the multiplexer to output debug data from portions of the processor associated with the known error. By dynamically selecting the appropriate debug signal groups, the appropriate data sets may be outputted into a trace array for debugging, assisting users in determining where problems exist in the processor.

Figure 1:
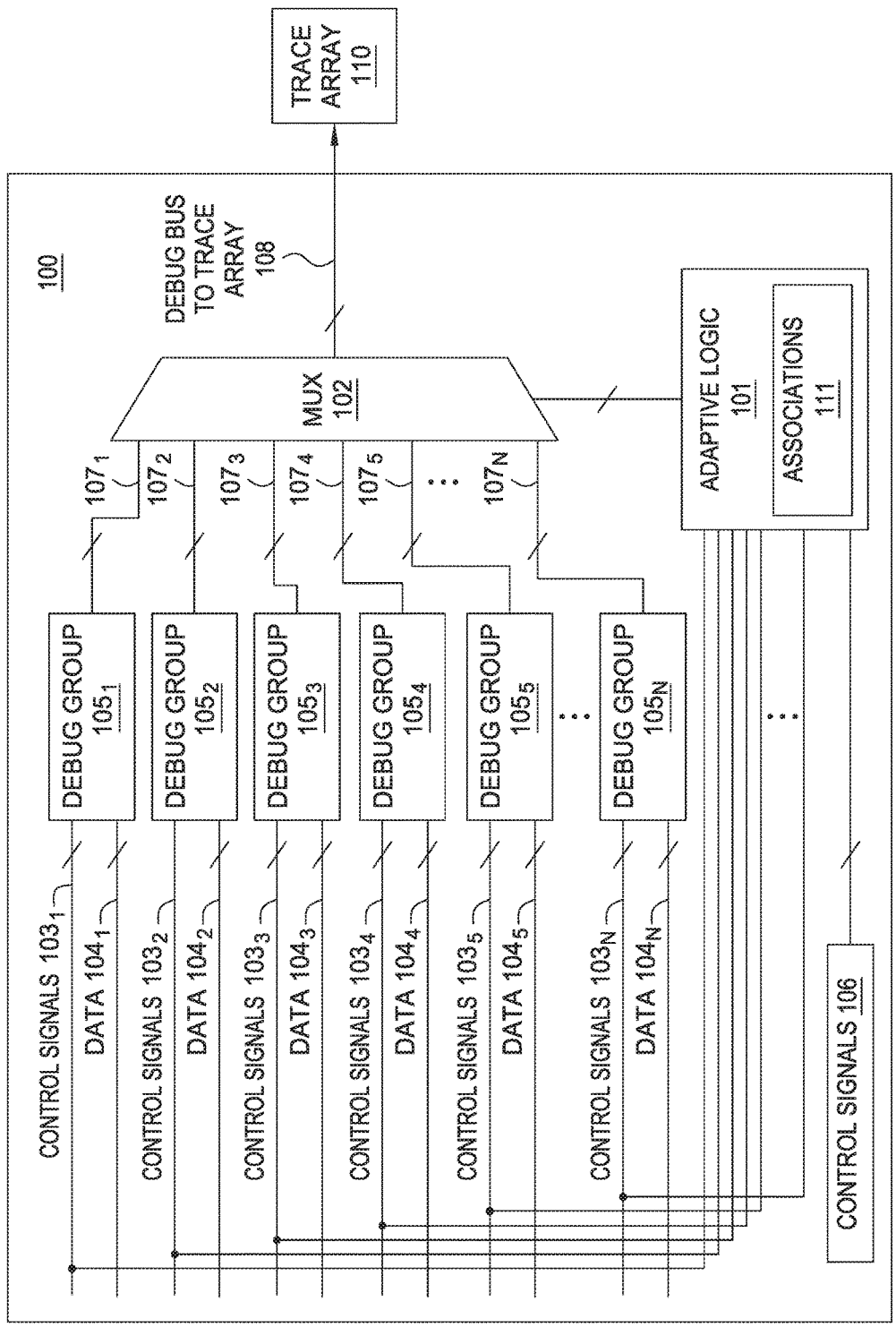
FIG. 1 illustrates a debug bus which provides adaptive debug tracing for microprocessors, according to one embodiment.

FIG. 1 illustrates a portion of a debug bus 100 which provides adaptive debug tracing, according to one embodiment. The debug bus 100 may be a portion of a microprocessor, or may be a component in a software tool used to design a microprocessor. Generally, the debug bus 100 connects various components of a processor, providing state data and other signals to one or more trace arrays 110 for debugging. As shown, the debug bus 100 includes an adaptive logic, 101, a multiplexer 102, a plurality of control signals $103_{1-N}$, a plurality of data signals $104_{1-N}$, a plurality of debug groups $105_{1-N}$, a set of additional control signals 106, and an example trace array 110.

The multiplexer 102 is a device that selects one of two or more input signals and forwards the selected input to a single output line (or signal, or port). More specifically, the mux 102 has a plurality of input ports $107_{1-N}$ and an output port 108. As shown, therefore, the mux 102 selects one of the plurality of debug groups $105_{1-N}$ for writing to the trace array 110 via the output 108. As described in greater detail below, the adaptive logic 101 is able to dynamically configure the mux 102 to select the debug groups $105_{1-N}$ that are relevant to current failures or other error conditions in the processor. Doing so allows relevant debut data to be outputted via the output port 108 to the trace array 110 for debugging that might not otherwise be captured in the trace array 110.

The control signals $103_{1-N}$ includes all signals in a processor that do not carry data $104_{1-N}$. For example, the control signals $103_{1-N}$ may include signals that control the flow of data in the processor. If, for example, metadata of control signal $101_1$ has a value of 1 (or is active), data $104_1$ corresponding to the control signal $101_1$ may follow a particular path in the processor. The data signals $104_{1-N}$ carry data for processing in the processor. The debug groups $105_{1-N}$ each include a set of related control signals $103_{1-N}$. The control signals $103_{1-N}$ for a given debug group $105_{1-N}$ may be based, for example, from a related physical area of the processor (such as a load/store unit, fetch unit, etc.), a related function of the processor, and the like. The additional control signals 106 are representative of other control signals in a processor, such as error detection units, work around triggers, and the like. The additional control signals 106 may include control signals that are not ultimately outputted to the trace array 110, but may be useful in identifying the cause of an error.

The adaptive logic 101 dynamically configures the mux 102 based on one or more of the control signals $103_{1-N}$, the additional control signals 106, and the associations 111. The adaptive logic 101 may be implemented as hardware, software, or any combination thereof. As shown, the adaptive logic 101 may include a set of associations 111 between settings for the mux 102 and one or more of the control signals $103_{1-N}$, additional control signals 106, components in the processor, failure types detected in the processor, error checkers, work around triggers, or any other type of event detected in the processor. For example, a first association 111 may cause the adaptive logic 101 to configure the mux 102 to output debug group $105_1$ via the output port 108 upon detecting an error that is associated with one or more of the processor structures, tasks, or location associated with control signal $103_1$. Therefore, if the adaptive logic 101 identifies the error (e.g., a control signal associated with the error is active), or determines that the error is predicted to occur, the adaptive logic 101 may configure the mux 102 to output debug group $105_1$ via the output port 108, even if the mux 102 is currently configured to output a different debug group $105_{2-N}$. As another example, a second association in the associations 111 may associate control signals $103_{1-N}$ from different groups and structures in the processor. For example a hang or other error may occur while operating in transactional-memory mode, rather than in the default operating mode. In such an example, the adaptive logic 101 may look at some combination of the "exceptions" debug bus, "unimapper" history buffer debug bus, and register file debug bus, as these contain the transactional memory state of the processor thread and information about each register used in the transaction. Based on this association in the associations 111, the adaptive logic 101 may configure the mux 102 to serve these units such that their state data is outputted to the trace array 110.

Generally, therefore, when a processor including the debug bus 100 is powered on, the adaptive logic 101 may apply default settings for configuring the mux 102. However, as the processor is operational, the adaptive logic 101 may monitor control points in the processor (e.g., the control signals 104 and the additional control signals 106) to detect and/or predict error conditions in the processor. Responsive to the detected or predicted error, the processor may generate a trigger or other interrupt that causes the adaptive logic 101 to reconfigure the mux 102. Generally, in such cases, the adaptive logic 101 may reconfigure the mux 102 to ensure that relevant debug data associated with an actual or predicted error is outputted by the output port 108 of the mux 102 to the trace array 110. As errors or other triggers are detected by the adaptive logic 101, the adaptive logic 101 reconfigures the mux 102 to select the appropriate debug group 105 for outputting via the output port 108. Doing so allows the debug bus 100 to output relevant debug data while discarding irrelevant debug data.

Figure 2:
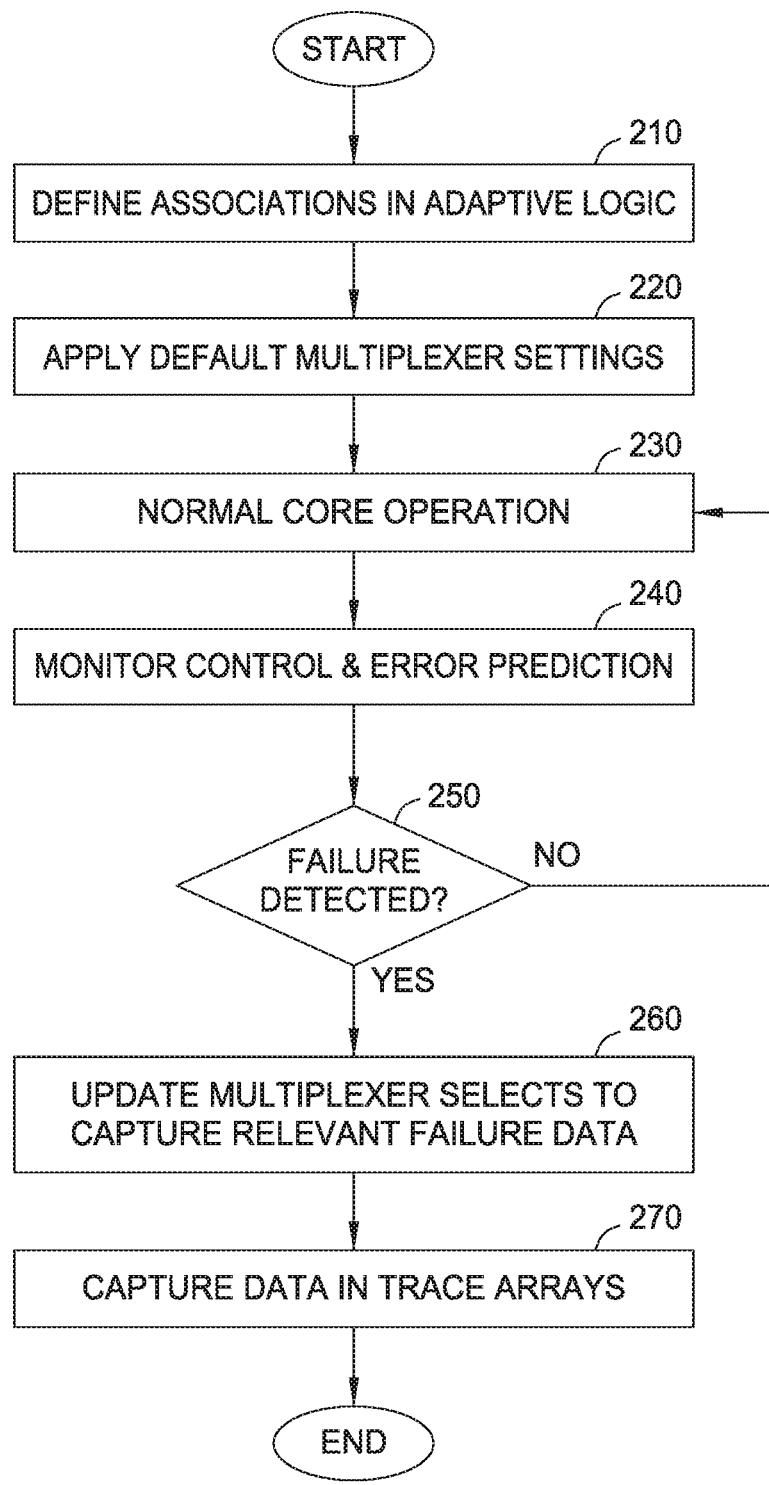
FIG. 2 is a flow chart illustrating a method to provide adaptive debug tracing for microprocessors, according to one embodiment.

FIG. 2 is a flow chart illustrating a method 200 to provide adaptive debug tracing for microprocessors, according to one embodiment. As shown, the method 200 begins at block 210, where the associations 111 in the adaptive logic 101 are defined. The associations 111 may generally cause the adaptive logic 101 to configure the mux 102 to output relevant debug data from one or more of the debug groups $105_{1-N}$. For example, completion logic in the processor may be associated with debug group $105_2$. One issue that may arise in a processor's completion logic is a hang. The associations 111 may therefore define an association between a hang in the completion logic and the debug group $105_2$. When a hang is detected (or an indication thereof), the adaptive logic 102 may reference the associations 111, identify the association between the hang and the debug group $105_2$, and configure the mux 102 to output the debug data from debug group $105_2$ via the output port 108.

At block 220, the adaptive logic 101 may apply the default settings for the mux 102. For example, the default settings may specify to serve debug group $105_1$. At block 230, the processor may undergo normal core operation. At block 240, the adaptive logic 101 may monitor control signals $103_{1-N}$ and/or control signals 106 (which may include error prediction logic). At block 250, the adaptive logic 101 may determine whether a failure has been detected and/or predicted. For example, the adaptive logic 101 may reference the associations 111 to determine whether a received control signal is associated with an error. The adaptive logic 101 may further be pre-programmed to identify specific types of errors or predicted errors. As an example, the processor may include logic which monitors a counter associated with the program counter (PC), where the counter keeps track of the number of cycles since the last completion of an instruction. If the value of the counter for the PC exceeds a predefined threshold, the logic in the CPU may determine that a hang may occur. If a failure is not detected (or predicted), the method returns to block 230, where normal CPU operation continues.

If a failure is detected (or predicted), the method proceeds to block 260, where the adaptive logic 101 updates the multiplexer 102 to capture relevant debug data. For example, if the counter associated with the program counter exceeds the threshold, a hang in the instruction scheduling unit may occur. In response, the adaptive logic 101 may update the multiplexer 102 to capture debug data from the control signals 103 (and/or debug group 105) associated with the instruction scheduling unit. As previously indicated, the adaptive logic 101 may modify the mux 102 based on the associations 111 which specify the control signals 103 (and/or debug group 105) that are associated with the instruction scheduling unit. Often, the adaptive logic 101 may identify (or receive) multiple triggers corresponding to multiple errors or predicted errors. In such embodiments, the adaptive logic 101 may configure the mux 102 to allocate access to the output port 108 by the corresponding control groups 103 and debug groups 105 associated with each error. Therefore, the trace arrays 110 will be able to capture multiple sets of relevant data based on the dynamic configuration of the mux 102. At block 270, debug data is captured in the trace array.

Figure 3:
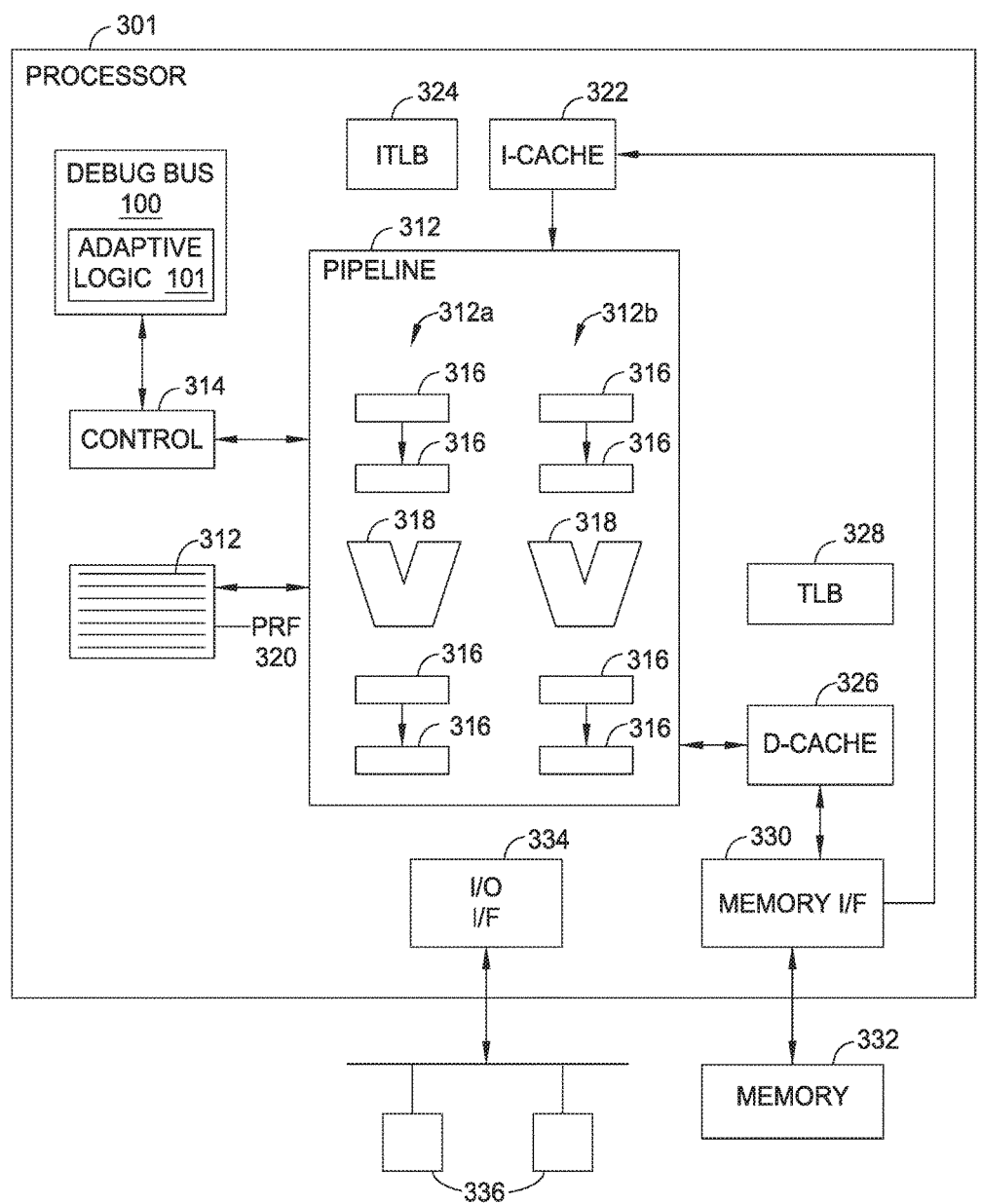
FIG. 3 is a functional block diagram of an example processor including a debug bus which provides adaptive debug tracing, according to one embodiment.

FIG. 3 is a functional block diagram of an example processor 301 including a debug bus 100 which provides adaptive debug tracing, according to one embodiment. Generally, the processor 301 may be used in any type of computing device including, without limitation, a desktop computer, a laptop computer, a tablet computer, and a smart phone. Generally, the CPU 301 may include numerous variations, and the CPU 301 shown in FIG. 3 is for illustrative purposes and should not be considered limiting of the disclosure. For example, the CPU 301 may be a graphics processing unit (GPU). In one aspect, the CPU 301 is disposed on an integrated circuit including a debug bus 100.

Generally, the processor 301 executes instructions in an instruction execution pipeline 312 according to control logic 314. The pipeline 312 may be a superscalar design, with multiple parallel pipelines, including, without limitation, parallel pipelines 312a and 312b. The pipelines 312a, 312b include various non-architected registers (or latches) 316, organized in pipe stages, and one or more arithmetic logic units (ALU) 318. A physical register file 320 includes a plurality of architected registers 321.

The pipelines 312a, 312b may fetch instructions from an instruction cache (I-Cache) 322, while an instruction-side translation lookaside buffer (ITLB) 324 may manage memory addressing and permissions. Data may be accessed from a data cache (D-cache) 326, while a main translation lookaside buffer (TLB) 328 may manage memory addressing and permissions. In some aspects, the ITLB 324 may be a copy of a part of the TLB 328. In other aspects, the ITLB 324 and the TLB 328 may be integrated. Similarly, in some aspects, the I-cache 322 and D-cache 326 may be integrated, or unified. Misses in the I-cache 322 and/or the D-cache 326 may cause an access to higher level caches (such as L2 or L3 cache) or main (off-chip) memory 332, which is under the control of a memory interface 330. The processor 301 may include an input/output interface (I/O IF) 334, which may control access to various peripheral devices 336, which may include a wired network interface and/or a wireless interface (e.g., a modem) for a wireless local area network (WLAN) or wireless wide area network (WWAN).

As shown, the CPU 301 includes the debug bus 100 and the adaptive logic 101. Generally, the CPU 301 includes all apparatuses, logic, and methods described with reference to FIGS. 1 and 2. As described above, the adaptive logic 101 is configured to dynamically configure the multiplexer 102 to output relevant debug data to the trace array 110 based on the associations 111. For example, the associations 111 may associate errors with the pipeline 312 with a specific setting for the mux 102, such that when errors associated with the pipeline 312 are detected, the adaptive logic 101 may configure the mux 102 to output debug data associated with the pipeline 312. Generally, the associations 111 may be based on components of the CPU 312, failure types, error checkers, and work around triggers.

Figure 4:
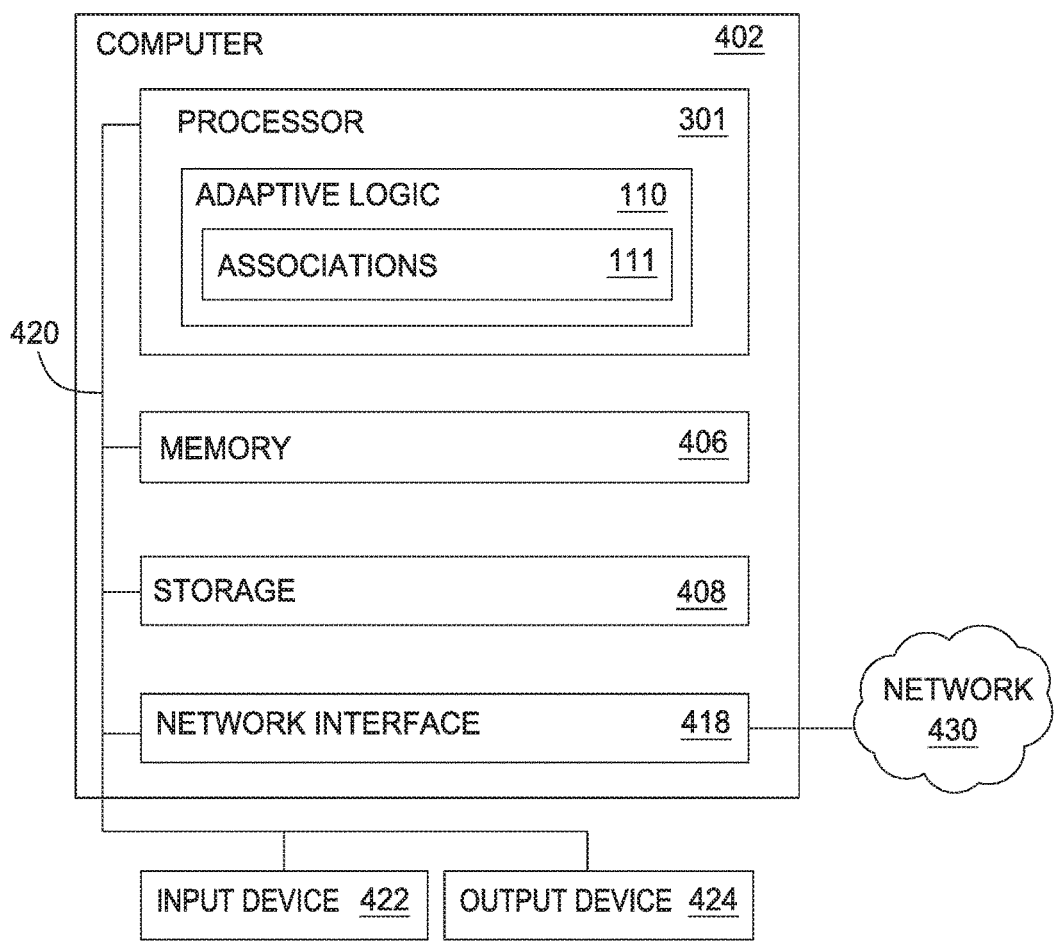
FIG. 4 illustrates a system including a processor which includes a debug bus that provides adaptive debug tracing, according to one embodiment.

FIG. 4 illustrates a system 400 including the processor 301 having a debug bus that provides adaptive debug tracing, according to one embodiment. The networked system 400 includes a computer 402. The computer 402 may also be connected to other computers via a network 430. In general, the network 430 may be a telecommunications network and/or a wide area network (WAN). In a particular embodiment, the network 430 is the Internet.

The computer 402 generally includes the processor 301 which obtains instructions and data via a bus 420 from a memory 406 and/or a storage 408. The computer 402 may also include one or more network interface devices 418, input devices 422, and output devices 424 connected to the bus 420. The computer 402 is generally under the control of an operating system (not shown). Examples of operating systems include the UNIX operating system, versions of the Microsoft Windows operating system, and distributions of the Linux operating system. (UNIX is a registered trademark of The Open Group in the United States and other countries. Microsoft and Windows are trademarks of Microsoft Corporation in the United States, other countries, or both. Linux is a registered trademark of Linus Torvalds in the United States, other countries, or both.) More generally, any operating system supporting the functions disclosed herein may be used. The processor 404 is a programmable logic device that performs instruction, logic, and mathematical processing, and may be representative of one or more CPUs. The network interface device 418 may be any type of network communications device allowing the computer 402 to communicate with other computers via the network 430.

The storage 408 is representative of hard-disk drives, solid state drives, flash memory devices, optical media and the like. Generally, the storage 408 stores application programs and data for use by the computer 402. In addition, the memory 406 and the storage 408 may be considered to include memory physically located elsewhere; for example, on another computer coupled to the computer 402 via the bus 420.

The input device 422 may be any device for providing input to the computer 402. For example, a keyboard and/or a mouse may be used. The input device 422 represents a wide variety of input devices, including keyboards, mice, controllers, and so on. Furthermore, the input device 422 may include a set of buttons, switches or other physical device mechanisms for controlling the computer 402. The output device 424 may include output devices such as monitors, touch screen displays, and so on.

As shown, the processor 301 includes the adaptive logic 101 and the associations 111. As previously indicated, the adaptive logic 101 may use the associations 111 to configure the mux 102 to output relevant debug data when errors occur (or are predicted to occur) in the CPU 301.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the foregoing, reference is made to embodiments presented in this disclosure. However, the scope of the present disclosure is not limited to specific described embodiments. Instead, any combination of the recited features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the recited aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method, comprising:
receiving, by an adaptive logic, an indication of a first error in a processor;
identifying, by the adaptive logic based on an association in an association structure, a first control signal, of a plurality of control signals in a debug bus, associated with the error, wherein each of the plurality of control signals are coupled to one of a plurality of input ports of a multiplexer, wherein a configuration state of the multiplexer outputs a second control signal to a trace array; and
changing, by the adaptive logic based on the association in the association structure and by sending a signal to the multiplexer, the configuration state of the multiplexer to output the first control signal to the trace array.

2. The method of claim 1, wherein the association structure associates the first control signal with a first debug group, of a plurality of debug groups, wherein changing the configuration state of the multiplexer to output the first control signal to the trace array comprises configuring the multiplexer to serve the first debug group, wherein the association structure associates each debug group with a respective subset of the plurality of control signals in the debug bus, wherein the association structure associates each control signal with a respective portion of a plurality of portions of the processor, wherein changing the configuration state of the multiplexer facilitates debugging of a greater number of the plurality of portions of the processor relative to debugging the processor using a static configuration state of the multiplexer, wherein the configuration state of the multiplexer is changed without having to restart the processor.

3. The method of claim 1, further comprising, prior to receiving the indication of the first error:
identifying, by the adaptive logic in the association structure, a set of default settings for the multiplexer; and
changing, by the adaptive logic, the configuration state of the multiplexer to serve the second control signal of the plurality of control signals according to the set of default settings.

4. The method of claim 1, wherein the indication of the first error comprises one or more of: (i) metadata carried by a control signal, (ii) an indication of a work around trigger, and (iii) an indication of an error checker, wherein the first control signal is identified in a logic associating the indication of the first error with the first control signal.

5. The method of claim 1, wherein changing the configuration state of the multiplexer to output the first control signal causes the multiplexer to cease outputting the second control signal, wherein the second control signal is not associated with the first error.

6. The method of claim 5, wherein the association comprises a first association of a plurality of associations in the association structure, further comprising subsequent to changing the configuration state of the multiplexer:
receiving, by the adaptive logic, an indication of a second error;
identifying, by the adaptive logic based on a second association of the plurality of associations in the association structure, a third control signal, of the plurality of control signals, associated with the indication of the second error; and
changing, by the adaptive logic, the configuration state of the multiplexer to output the third control signal to the trace array.

7. The method of claim 1, wherein the first control signal is identified in the association logic associating the indication of the first error with the first control signal and a first setting for the multiplexer, of a plurality of settings for the multiplexer, wherein changing the configuration state of the multiplexer comprises applying the first setting for the multiplexer to serve the first control signal to the trace array.

8. A system, comprising:
a processor configured to perform an operation comprising:
receiving, by an adaptive logic, an indication of a first error in the processor;
identifying, by the adaptive logic based on an association in an association structure, a first control signal, of a plurality of control signals in a debug bus, associated with the error, wherein each of the plurality of control signals are coupled to one of a plurality of input ports of a multiplexer, wherein a configuration state of the multiplexer outputs a second control signal to a trace array; and
changing, by the adaptive logic based on the association in the association structure and by sending a signal to the multiplexer, the configuration state of the multiplexer to output the first control signal to the trace array.

9. The system of claim 8, wherein the association structure associates the first control signal with a first debug group, of a plurality of debug groups, wherein changing the configuration state of the multiplexer to output the first control signal to the trace array comprises configuring the multiplexer to serve the first debug group, wherein the association structure associates each debug group with a respective subset of the plurality of control signals in the debug bus, wherein the association structure associates each control signal with a respective portion of a plurality of portions of the processor, wherein changing the configuration state of the multiplexer facilitates debugging of a greater number of the plurality of portions of the processor relative to debugging the processor using a static configuration state of the multiplexer, wherein the configuration state of the multiplexer is changed without having to restart the processor.

10. The system of claim 8, wherein the association comprises a first association of a plurality of associations in the association structure, the operation further comprising, prior to receiving the indication of the first error:
identifying, by the adaptive logic in the association structure, a set of default settings for the multiplexer; and
changing, by the adaptive logic, the configuration state of the multiplexer to serve the second control signal of the plurality of control signals according to the set of default settings.

11. The system of claim 8, wherein the indication of the first error comprises one or more of: (i) metadata carried by a control signal, (ii) an indication of a work around trigger, and (iii) an indication of an error checker, wherein the first control signal is identified in a logic associating the indication of the first error with the first control signal.

12. The system of claim 8, wherein changing the configuration state of the multiplexer to output the first control signal causes the multiplexer to cease outputting the second control signal, wherein the second control signal is not associated with the first error.

13. The system of claim 12, the operation further comprising subsequent to changing the configuration state of the multiplexer:
  receiving, by the adaptive logic, an indication of a second error;
  identifying, by the adaptive logic based on a second association of the plurality of associations in the association structure, a third control signal, of the plurality of control signals, associated with the indication of the second error; and
  changing, by the adaptive logic, the configuration state of the multiplexer to output the third control signal to the trace array.

14. The system of claim 8, wherein the first control signal is identified in the association logic associating the indication of the first error with the first control signal and a first setting for the multiplexer, of a plurality of settings for the multiplexer, wherein changing the configuration state of the multiplexer comprises applying the first setting for the multiplexer to serve the first control signal to the trace array.

15. A processor, comprising:
  a debug bus;
  a multiplexer; and
  an adaptive logic configured to perform an operation comprising:
    receiving an indication of a first error in the processor;
    identifying, based on an association in an association structure, a first control signal, of a plurality of control signals in a debug bus, associated with the error, wherein each of the plurality of control signals are coupled to one of a plurality of input ports of a multiplexer, wherein a configuration state of the multiplexer outputs a second control signal to a trace array; and
    changing, based on the association in the association structure and by sending a signal to the multiplexer, the configuration state of the multiplexer to output the first control signal to the trace array.

16. The processor of claim 15, wherein the association structure associates the first control signal with a first debug group, of a plurality of debug groups, wherein changing the configuration state of the multiplexer to output the first control signal to the trace array comprises configuring the multiplexer to serve the first debug group, wherein the association structure associates each debug group with a respective subset of the plurality of control signals in the debug bus, wherein the association structure associates each control signal with a respective portion of a plurality of portions of the processor, wherein changing the configuration state of the multiplexer facilitates debugging of a greater number of the plurality of portions of the processor relative to debugging the processor using a static configuration state of the multiplexer, wherein the configuration state of the multiplexer is changed without having to restart the processor.

17. The processor of claim 15, the operation further comprising, prior to receiving the indication of the first error:
  identifying, in the association structure, a set of default settings for the multiplexer; and
  changing the configuration state of the multiplexer to serve the second control signal of the plurality of control signals according to the set of default settings.

18. The processor of claim 15, wherein the indication of the first error comprises one or more of: (i) metadata carried by a control signal, (ii) an indication of a work around trigger, and (iii) an indication of an error checker, wherein the first control signal is identified in a logic associating the indication of the first error with the first control signal.

19. The processor of claim 15, wherein changing the configuration state of the multiplexer to output the first control signal causes the multiplexer to cease outputting the second control signal, wherein the second control signal is not associated with the first error.

20. The processor of claim 19, wherein the association comprises a first association of a plurality of associations in the association structure, the operation further comprising subsequent to changing the configuration state of the multiplexer:
  receiving an indication of a second error;
  identifying, based on a second association of the plurality of associations in the association structure, a third control signal, of the plurality of control signals, associated with the indication of the second error; and
  changing the configuration state of the multiplexer to output the third control signal to the trace array.

* * * * *